United States Patent
Leibowitz et al.

(10) Patent No.: US 8,472,204 B2
(45) Date of Patent: Jun. 25, 2013

(54) ADVANCED MEZZANINE CARD FOR HOSTING A PMC OR XMC

(75) Inventors: Mark E. Leibowitz, Ronkonkoma, NY (US); Michael M. Borthwick, Brooklyn, NY (US); Saeed Karamooz, Henderson, NV (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 136 days.

(21) Appl. No.: 13/130,680

(22) PCT Filed: Sep. 15, 2010

(86) PCT No.: PCT/US2010/048904
§ 371 (c)(1),
(2), (4) Date: May 23, 2011

(87) PCT Pub. No.: WO2011/034900
PCT Pub. Date: Mar. 24, 2011

(65) Prior Publication Data
US 2011/0228474 A1    Sep. 22, 2011

Related U.S. Application Data

(60) Provisional application No. 61/242,641, filed on Sep. 15, 2009.

(51) Int. Cl.
*H05K 1/14* (2006.01)
*H05K 5/00* (2006.01)

(52) U.S. Cl.
USPC ........... 361/758; 361/742; 361/736; 361/752; 361/756; 361/759; 361/753

(58) Field of Classification Search
USPC ................ 361/736, 742, 728, 730, 752, 756, 361/758, 759, 753; 439/74, 76.1, 65; 710/301
See application file for complete search history.

(56) References Cited

U.S. PATENT DOCUMENTS

| | | | |
|---|---|---|---|
| 5,984,688 A * | 11/1999 | Norris | 439/64 |
| 6,097,591 A * | 8/2000 | Ircha | 361/679.6 |
| 6,935,868 B1 * | 8/2005 | Campini et al. | 439/67 |
| 7,101,188 B1 * | 9/2006 | Summers et al. | 439/59 |
| 7,172,432 B2 * | 2/2007 | Campini et al. | 439/74 |
| 7,248,479 B2 * | 7/2007 | Summers et al. | 361/721 |
| 7,326,067 B2 * | 2/2008 | Karamooz | 439/79 |
| 2006/0206647 A1 * | 9/2006 | Stahl et al. | 710/301 |
| 2006/0221559 A1 * | 10/2006 | Campini et al. | 361/679 |

\* cited by examiner

*Primary Examiner* — Anthony Haughton
*Assistant Examiner* — Zhengfu Feng
(74) *Attorney, Agent, or Firm* — Dilworth & Barrese, LLP; Michael J. Musella; Daniel J. Long

(57) ABSTRACT

A card assembly is disclosed comprising a carrier host card, an interposer printed wiring board (PWB) situated between the carrier host card and a hosted card, wherein the carrier host card and the interposer printed wiring board (PWB) are configured to have a space there-between. The card assembly further comprising a customized front panel including a first cutout for the carrier host card and a second cutout for said hosted card.

8 Claims, 7 Drawing Sheets

ADVANCED MEZZANINE CARD FOR HOSTING A PMC OR XMC

CROSS REFERENCE TO RELATED APPLICATION

This application claims the benefit of U.S. provisional application Ser. No. 61/242,641, filed Sep. 15, 2009, the entire contents of which are incorporated by reference herein.

FIELD OF THE INVENTION

The invention relates to hosting one of a PCI (peripheral card interface) mezzanine card or an XMC (switched mezzanine card) on a modified single width module form factor advanced mezzanine card for use in a Micro-TCA (microtelecon computing architecture) chassis or advanced mezzanine card (AMC) carrier.

DESCRIPTION OF THE RELATED ART

Modular systems are typically used in communication networks and avionic platforms where reliability and cost effectiveness are important factors. The modularity of the components in a modular system helps to reduce costs and improve reliability. A key component of a modular system is the modular platform. A modular platform includes, but is not limited to, backplanes that receive various types of circuit cards. These circuit cards may further include smaller circuit cards as front insertion Advanced Mezzanine Card (AMC) that provide additional functionality to the modular platform.

One drawback of the AMC as defined in PICMG AMC.0, incorporated by reference herein in its entirety, is that it does not physically support a capability for hosting a PMC, as a sub-assembly within a single width module form factor. PMCs are described in the IEEE 1386 specification, incorporated by reference herein in its entirety. A further associated drawback of the AMC is that it does not physically support a capability for hosting a XMC, as described in VITA 42 specification, incorporated herein in its entirety by reference. Only a Double Module AMC size form factor has enough room to accommodate a PMC/XMC. The current solutions for this situation are to use an AMC Double Module size form factor which has enough room to accommodate one or more add on cards, (e.g., PMC. XMC). However, using a Double Module AMC imposes a number of drawbacks including non-optimal chassis design which include additional cooling requirements, reduced capability to meet harsh environments, decreased reliability, increased size and increased weight. Accordingly for these reasons as well as others this solution is expensive and not favored in the industry.

A capability for hosting a PMC or XMC on a convection cooled AMC Single Module size form factor is very desirable in order to optimize the chassis design of a Micro-TCA chassis or AMC carrier. More particularly, such a capability allows a designer to be able to take advantage of the large number of I/O PMC, XMC, CCPMC or CCXMC modules that are presently available in the Commercial off the shelf (COTS) market in a minimum required real estate. It should be understood that many of the presently available I/O PMC, XMC, CCPMC or CCXMC modules are avionic bus interfaces that may otherwise never be redesigned as an AMC due to the low volume requirements. Also there are unique designed PMC/XMC's such as video capture and processors that are a niche market and they may also never be redesigned as an AMC module.

Therefore, what is needed in the industry is a capability to host a PMC or XMC on an AMC single module size form factor. In so doing, a chassis design of a Micro-TCA chassis or AMC carrier may be optimized without incurring the high cost of redesign of the existing I/O PMC, XMC, CCPMC or CCXMC modules for use with the AMC single module size form factor.

Accordingly the present invention described below and set forth in the claims is directed to an apparatus and associated methods designed as an improvement to the COTS and to overcome the aforementioned drawbacks of devices available on the market today.

SUMMARY OF THE INVENTION

The present disclosure provides a card assembly comprising, in one embodiment, a carrier host card, an interposer printed wiring board (PWB) situated between the carrier host card and a hosted card, wherein said carrier host card and said interposer printed wiring board (PWB) are configured to have a space there-between, and a customized front panel including a first cutout for the carrier host card and a second cutout for said hosted card. In an embodiment, the card assembly may further comprise at least one intermediate support to provide the spacing between said interposer PWB and said carrier host card. In various embodiments, the spacing may be created by a standoff, a part of a frame or a spacer.

In one aspect, the carrier host card is an advanced mezzanine card printed wiring board (AMC PWB) which may be convection cooled or conduction cooled. The advanced mezzanine card printed wiring board (AMC PWB) may be a single module form factor board.

In one aspect, the hosted card may be either a PCI Mezzanine card (PMC) or a switched mezzanine card (XMC).

In one aspect, the interposer board is smaller than the advanced mezzanine card printed wiring board (AMC PWB) host card in at least one physical dimension, which can be a width dimension. In one embodiment, the width of the interposer board is smaller than the width of the modified mezzanine card in the range of 0.05 to about 0.15 inches.

In another embodiment, the present invention is directed to an assembly comprising a chassis further comprising a card assembly, wherein the card assembly comprises a carrier host card, an interposer printed wiring board (PWB) situated between the carrier host card and a hosted card, wherein said carrier host card and said interposer printed wiring board (PWB) are configured to have a space there-between, and a customized front panel including a first cutout for the carrier host card and a second cutout for said hosted card.

One advantage provided by the customized card assembly of the present disclosure is a capability to host a legacy PMC or XMC card on an AMC card having a single module size form factor. Accordingly, the chassis design of a Micro-TCA chassis or AMC carrier, in which the card assembly of the invention may be used, is optimized without incurring the high cost of redesign of a pre-existing inventory of legacy add-on cards/modules (e.g., existing commercially available legacy PMC and XMC card modules). The ability to allow users to incorporate a large pre-existing inventory of legacy add-on cards, such as PMC and XMC cards, provides enhanced functionality at modest cost, given that such cards are readily available on the COTS market. At the same time, the novel card/module guide system of the present invention is advantageously backward compatible with the standard mechanically sized AMC modules.

A further advantage provided by the present invention is that it becomes unnecessary to develop an AMC module to provide a function(s) which may already exist in a PMC or XMC form factor.

The present invention is further described in the drawings and the detailed description following herewith.

BRIEF DESCRIPTION OF THE DRAWINGS

These and other objects, features and advantages of the invention will be apparent from a consideration of the following Detailed Description Of The Invention considered in conjunction with the drawing Figures, in which.

DETAILED DESCRIPTION OF THE INVENTION

Figure 1:
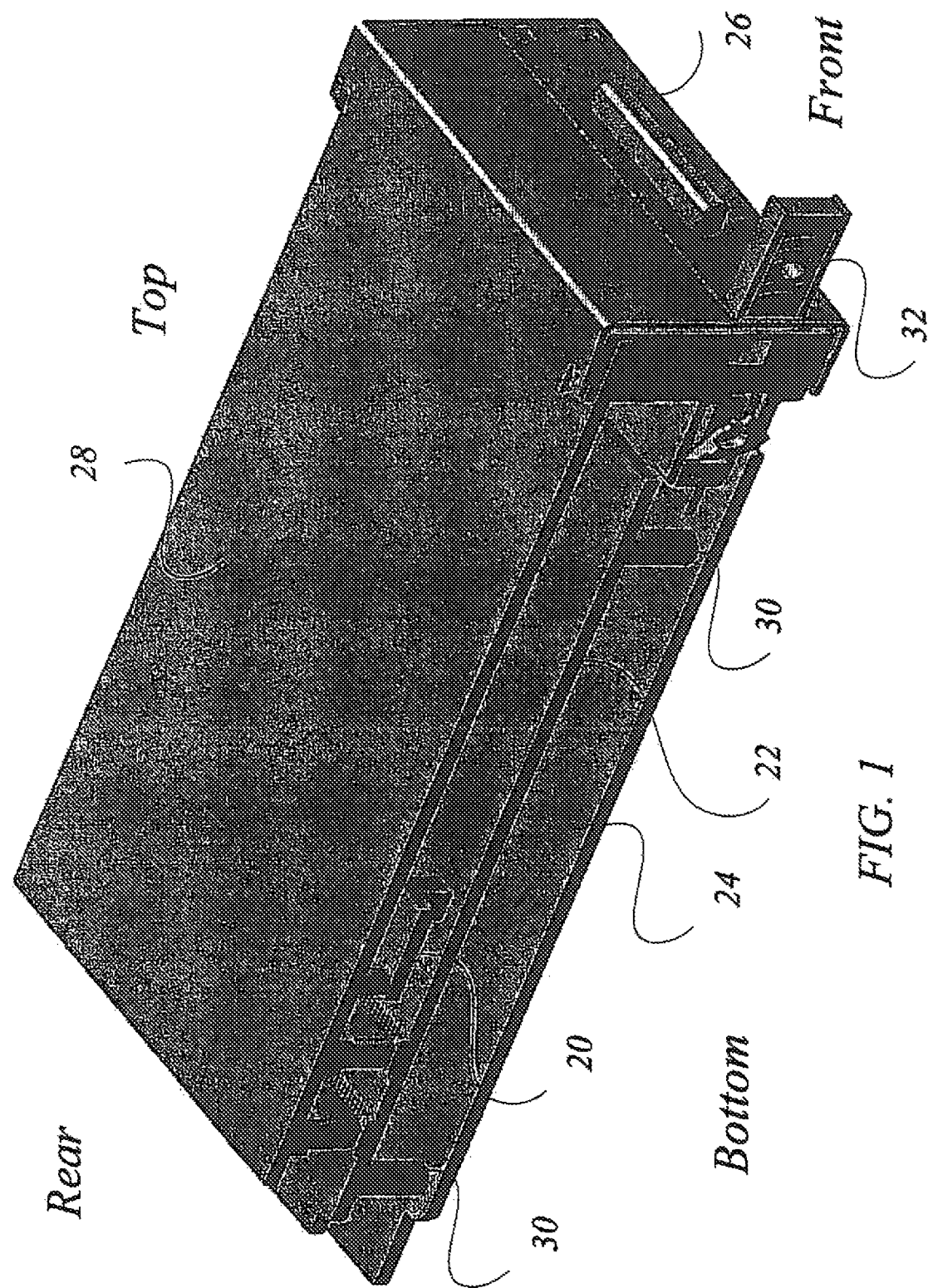
FIG. 1 representatively illustrates a right solid isometric view of preferred embodiment of an AMC single module size form factor carrier hosting a PMC/XMC Micro-TCA chassis, according to one embodiment.

In the following description, numerous specific details are set forth, such as implementations for Advanced Mezzanine Card (AMC) cards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present disclosure overcomes the prior art limitation of not being able to utilize a large pre-existing inventory of legacy products, such as PMC and XMC cards/modules, without resorting to use a standard double width AMC card/module as a host or otherwise having to design an AMC card module, either in a single or double width AMC form factor, to accommodate the functionality that presently exists within the presently available XMC or PMC form factor.

Accordingly, the present disclosure contemplates modifying a standard sized convection cooled AMC module having a single width module form factor by providing a capability for hosting a PMC or XMC on the AMC Single width module form factor in order to optimize the chassis design of a Micro-TCA chassis or AMC carrier. More particularly, such a capability allows a designer to be able to take advantage of the large number of I/O PMC, XMC, CCPMC or CCXMC modules that are presently available in the Commercial off the shelf (COTS) market in a minimum required real estate. The modification comprising, in one embodiment, a custom front panel for the AMC, an interposer printed wiring board (PWB) between the AMC and the PMC or XMC module to be hosted on the AMC configured to have a space there-between the PMC or XMC and the interposer PWB. The spacing may be implemented, in various embodiments as one of a standoff, a part of a frame or a spacer.

The modification allows the convection cooled AMC module to be hosted in a standard Micro-TCA chassis of AMC carrier. It is recognized by the present disclosure that such a modification is sufficient to accommodate the large pre-existing inventory of legacy products.

It is noted that the modified AMC card/module of the present disclosure maintains compliance with the AMC.0 specification, which, for example, includes features such as hot swapping. Further details of the AMC.0 specification may be readily obtained from www.PICMG.org, and is hereby incorporated in its entirety by reference.

While examples of the novel customized AMC card assembly of the invention are illustrated throughout the figures, it should be understood that the customized AMC card assembly is described herein for purposes of illustration and explanation only. It is understood that embodiments of the present invention are generally applicable to any insertable card/module that is non-standard in at least one dimension, such as optical card/modules, transceiver card/modules, and the like.

The present invention is further described in connection with FIGS. 1 through 7 and their description set forth below FIG. 1 representatively illustrates a customized AMC card assembly 10 including, in one embodiment, spacing member 20, an interposer printed wiring board (PWB) 22, a main advanced mezzanine card printed wiring board (AMC PWB) 24 for hosting one of a legacy PCI Mezzanine card/module 28 (PMC) or switched mezzanine card (XMC) card/module 28 and a customized front panel 26.

The spacing member 20 is configured to provide the spacing between the interposer printed wiring board (PWB) 22 and one of the legacy PCI Mezzanine card/module 28 (PMC) or switched mezzanine card (XMC) card/module 28. The spacing member 20 can be a standoff, a part of a frame or a spacer. There is also shown two additional spacing members 30 configured for spacing the interposer PWB 22 from the main AMC PWB 24 host card to create an overall assembly having the desired dimensions.

The interposer PWB 22 is positioned between the main AMC PWB 24 and the PMC or XMC card/module 28 to be hosted by the main AMC PWB 24. In one embodiment, the interposer PWB 22 is made slightly smaller in width than the main AMC PWB 24 in the range of about 0.05 to about 0.15 inches, preferably about 0.134 inches, to allow the customized AMC assembly 10 to slide into a standard Micro-TCA chassis or AMC carrier without interference from the existing card guides and card cell, as will be more fully described below with reference to FIGS. 6-8. A spacing member such as a customized standoff 20 mates the PMC card/module 28 or XMC card/module 28 to the interposer PWB 22 thereby allowing the customized AMC assembly 10 to slide into a standard chassis, such as, for example, a standard Micro-TCA chassis or AMC carrier.

Figure 2:
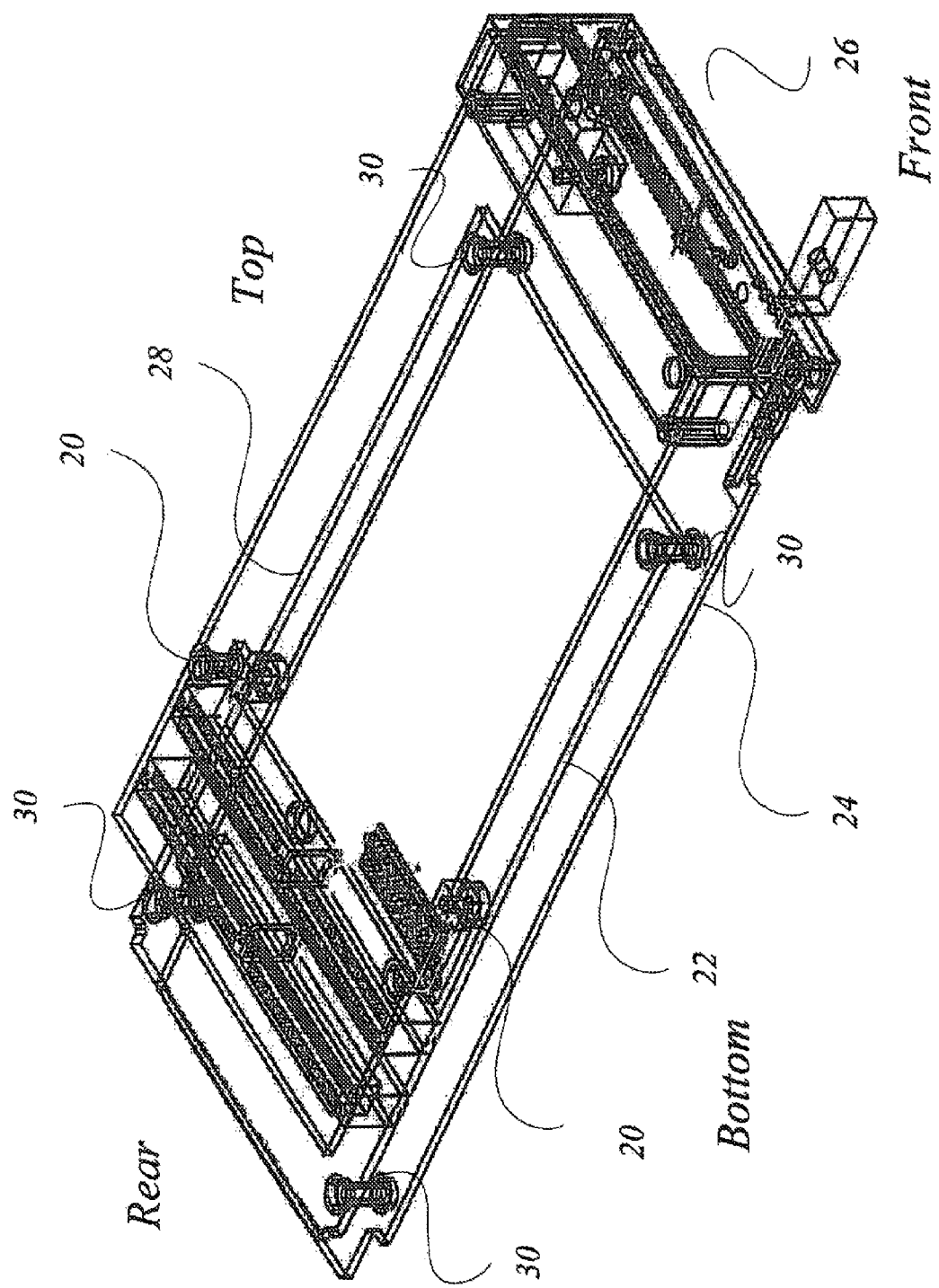
FIG. 2 representatively illustrates a frame isometric view of the AMC single module size form factor carrier of FIG. 1.
Figure 3:
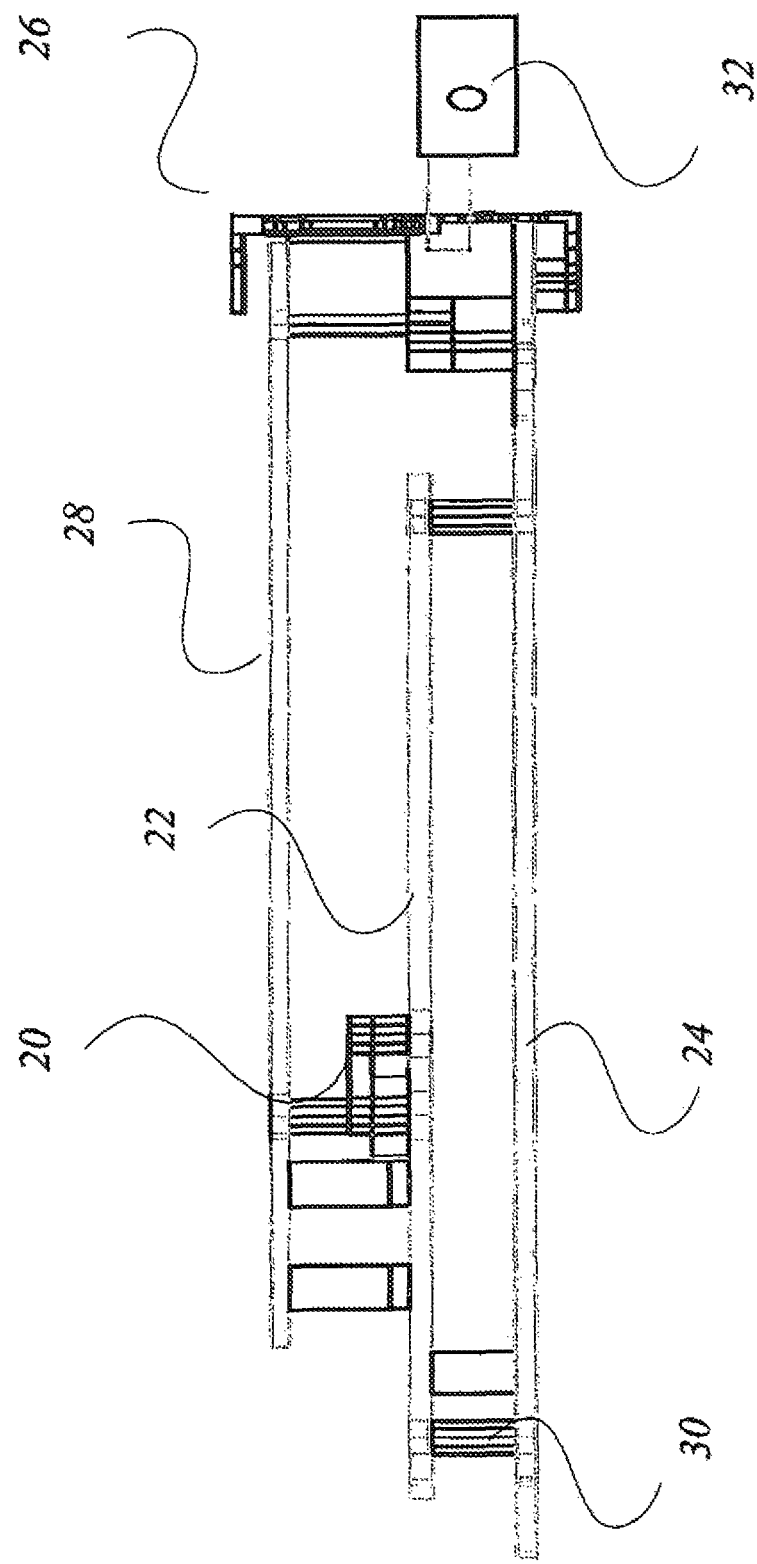
FIG. 3 representatively illustrates a side view of the AMC single module size form factor carrier of FIG. 1.

FIGS. 2-3 illustrate the customized AMC card assembly 10 of FIG. 1 in different views. FIG. 3 representatively illustrates a right, frame isometric view of the customized AMC card assembly 10 of FIG. 1. FIG. 3 representatively illustrates a side view of the customized AMC card assembly 10 of FIG. 1.

FIG. 2 representatively illustrates a frame isometric view of the customized AMC card assembly 10 of FIG. 1 comprised of an interposer PWB 22 positioned between the main AMC PWB 24 and the PMC card/module 28 or XMC card/module 28 to be hosted by the main AMC PWB 24. The customized AMC card assembly 10 further comprises a spacing member 20 for mating the PMC card/module 28 or XMC, hosted card/module 28 to the interposer PWB 22 thereby allowing the customized AMC assembly 10 to slide into a standard chassis. In addition, another spacing member 30 spaces the interposer PWB 22 from the main AMC PWB 24 host card to create an overall assembly having the desired dimensions.

FIG. 3 representatively illustrates a side view of the customized AMC card assembly 10 of FIG. 1. The AMC card assembly 10 is comprised of an interposer PWB 22 positioned between the main AMC PWB 24 and the PMC or XMC card/module 28 to be hosted by the main AMC PWB 24. The AMC carrier host card further comprises a customized standoff 20 for mating the PMC or XMC hosted card/module 28 to the interposer PWB 22 thereby allowing the customized AMC assembly 10 to slide into a standard chassis.

Figure 4:
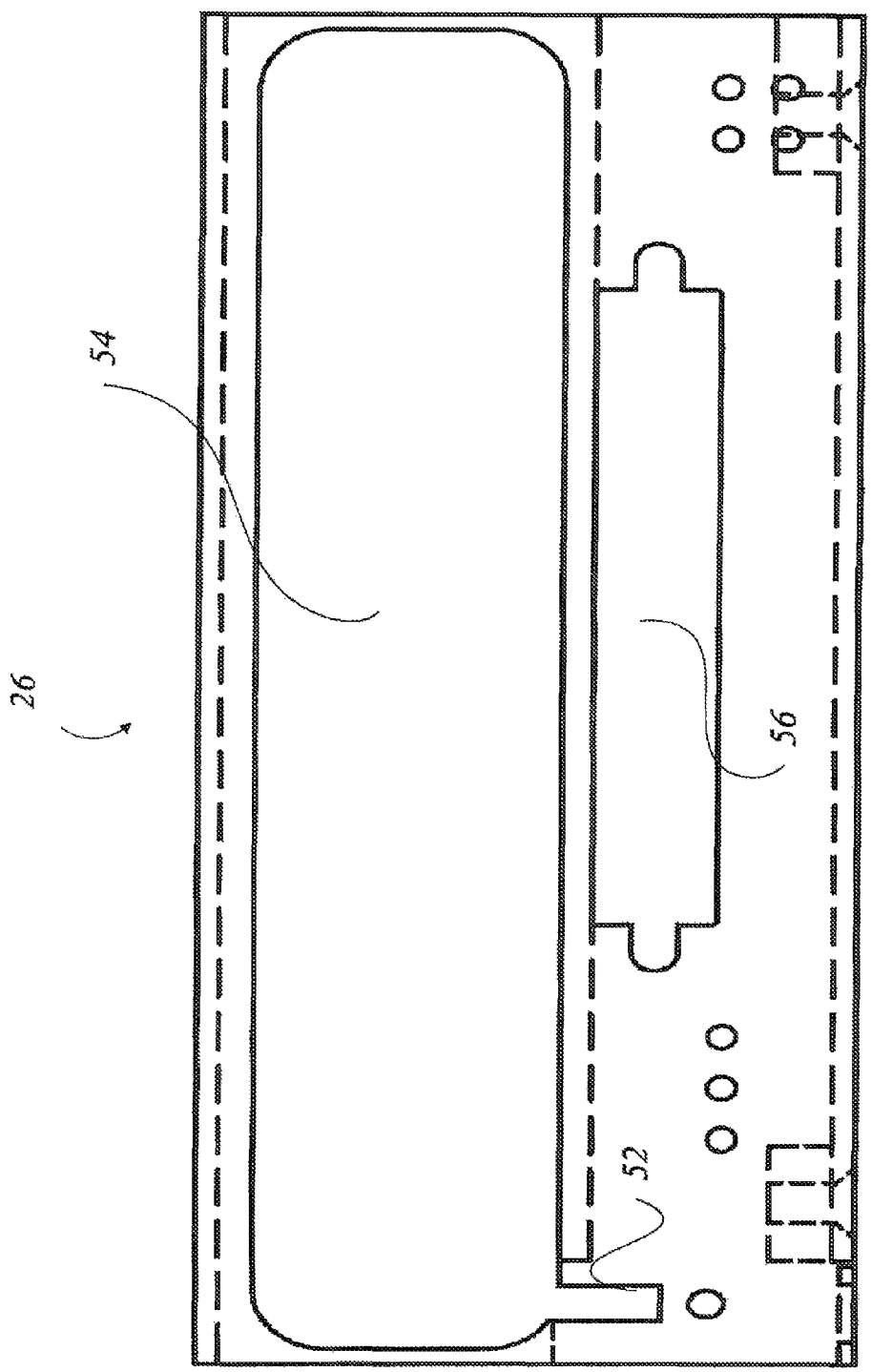
FIG. 4 representatively illustrates a front view of a panel right, frame view of the AMC single module size form factor carrier of FIG. 1.

FIG. 4 is a more detailed illustration of the customized front panel 26 of FIG. 1. The customized front panel 26 is shown to include a first cutout 54 for the AMC host card/module 24 and a second cutout 56 for the PMC/XMC card/module front panel. The customized front panel 26 maintains the prior art hot swap handle cutout 52 while keeping within the single width module slot, for example having the dimensions (1.14"×2.91"×7.15").

Figure 5:
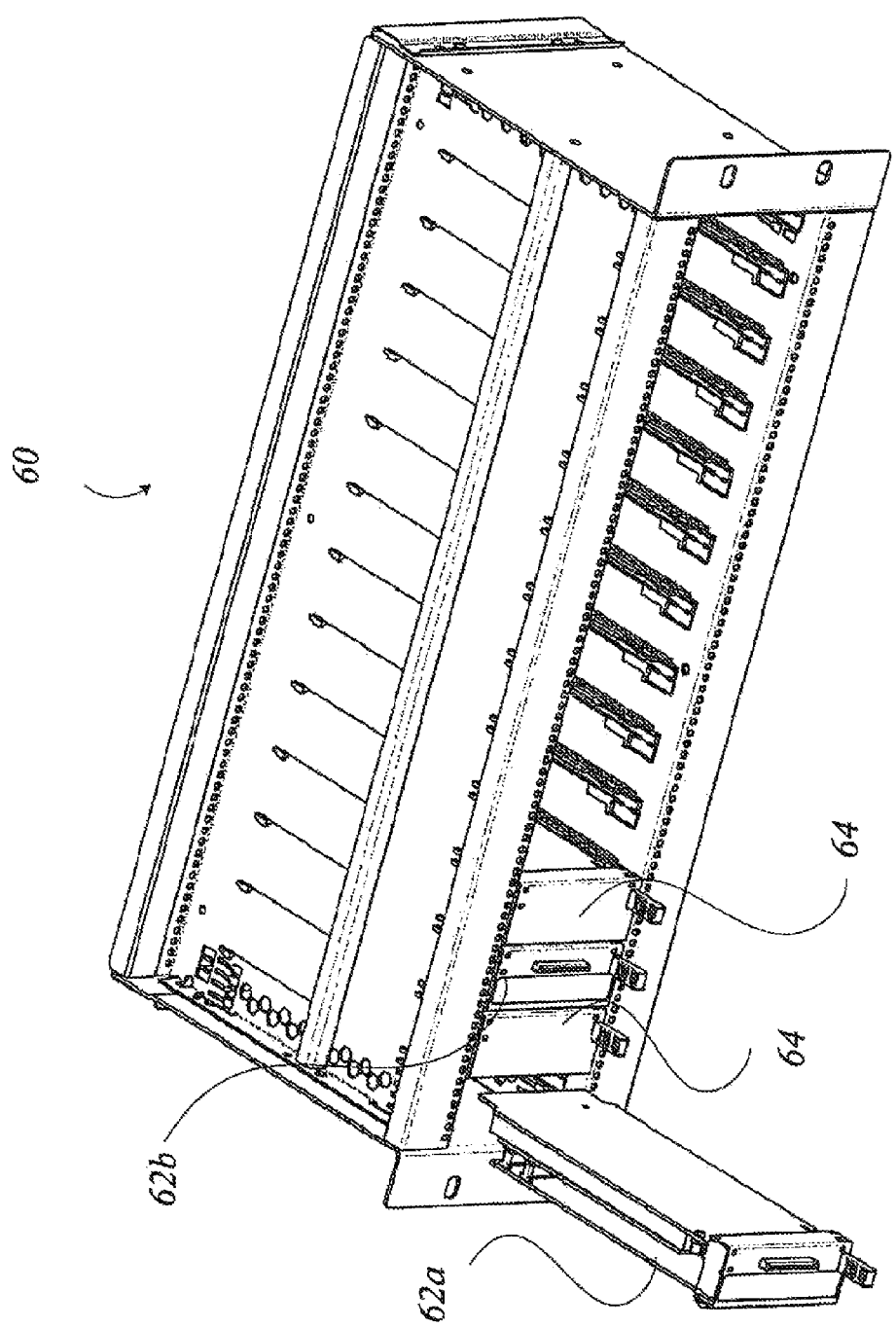
FIG. 5 representatively illustrates a Micro-TCA chassis including a standard single width full size AMC card/module and a single width full size AMC customized AMC card/module, where each card/module is shown with and without a front panel.

FIG. 5 representatively illustrates a conventional Micro-TCA chassis 60, which is an example of a typical subrack utilized in industry for accommodating conventional single width full size AMC cards. For ease of explanation, other components including cooling fans and ducting are not shown in FIG. 6. Details on Micro-TCA subrack design and configurations can be found in PICMG™ MicroTCA.0 (Micro Telecom Compute Architecture Base Specification) and is incorporated herein by reference in its entirety.

It should be understood that while the present disclosure describes a Micro-TCA chassis 60 for accommodating cards/modules defined according to the AMC specification, the disclosure is not so limited. In other embodiments, it is contemplated to use chasses and insertable cards/modules that comply with and/or are compatible with various technical specifications in addition to, or in the alternative to, the AMC Specification. For example the card/modules may be embodied as standard sized PC cards, common mezzanine cards, and the like. In other words, the scope of the present disclosure should not be construed as being limited to a particular chassis, module or card form factor.

With continued reference to FIG. 5, the Micro-TCA chassis 60 is suitable for accommodating both conventional single width AMC cards 64 and single width customized AMC cards of the invention 62a, 62b, both of which are of the single form factor. As shown, a first customized AMC card 62a is illustrated in a non-inserted orientation with respect to the Micro-TCA chassis 60 and a second customized AMC card 62b is shown in an inserted orientation with respect to the Micro-TCA chassis 60. The two standard AMC cards 64 are both shown in an inserted orientation with respect to the Micro-TCA chassis 60.

Figure 6:
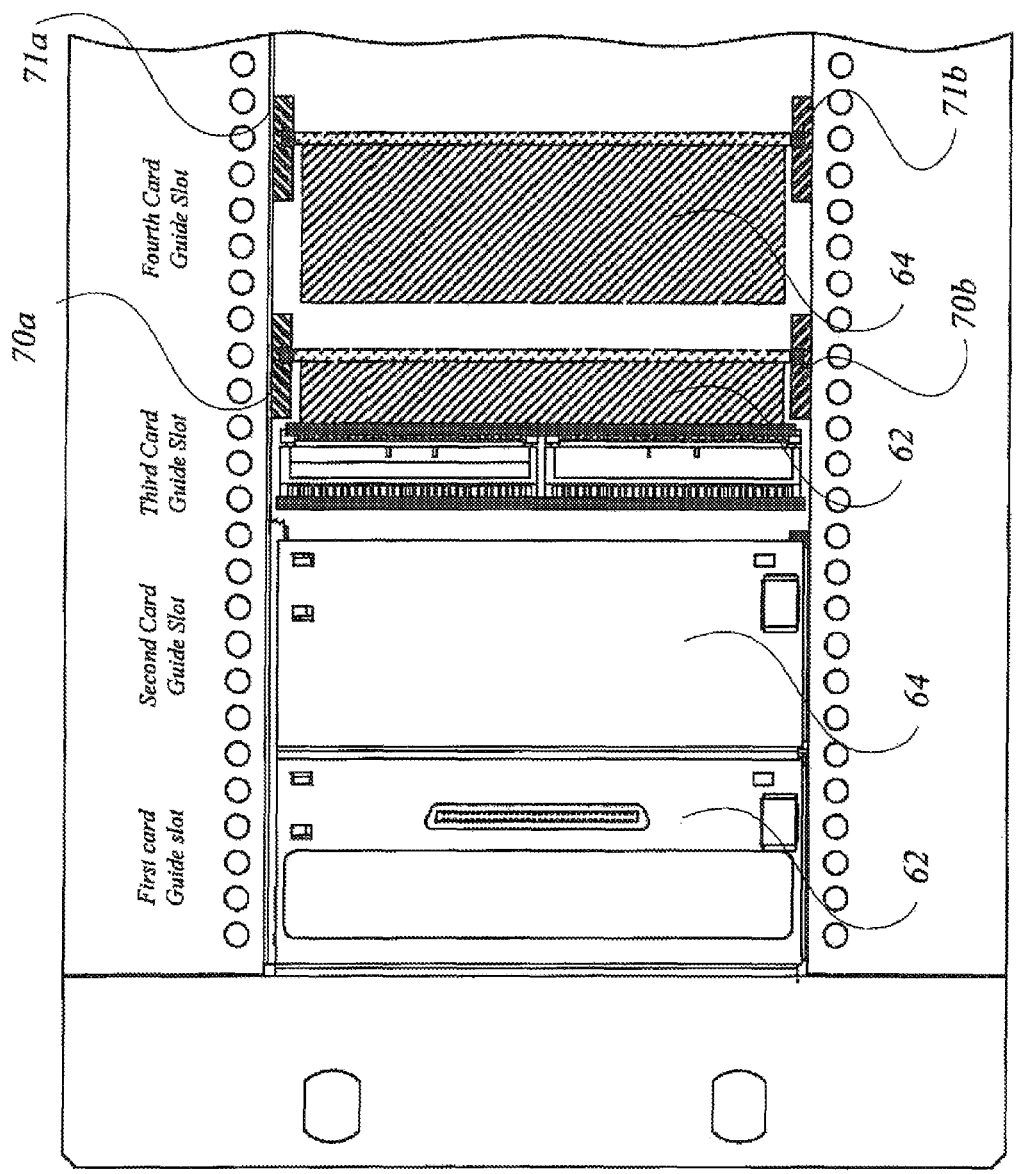
FIG. 6 representatively illustrates the Micro-TCA chassis of FIG. 5, further illustrating the standard single width full size AMC chassis card guide system.

FIG. 6 is a front view of the Micro-TCA chassis 60. The Micro-TCA chassis 60 includes a number of card slots, four are shown for ease of explanation. By way of example only, each card slot hosts one of a conventional AMC card 64 or a customized AMC card 62 of the invention The last two card guide slots (i.e., slots 3 and 4) are shown with their front panels removed to illustrate a portion of the chassis card guide system.

With continued reference to FIG. 6, a first card guide slot hosts a customized AMC card/module 62 of the invention. The second, adjoining card guide slot hosts a conventional AMC card 64. The third and fourth host a conventional AMC card 64 and a customized AMC card 62 of the invention, respectively.

It should be understood that in a conduction cooling model, the customized AMC card 62 of the invention may further comprise a heat sink for conducting the heat away from the assembly. The heat sink can be in the form of a clam shell and is designed out of material for diverting heat away from the assembly.

With continued reference to FIG. 6, the chassis card guide system 70 of the Micro TCA chassis 60 is shown to be made up of a number of individual chassis card guides 70, 71, each dedicated to a particular card guide slot. For example, the third card guide slot includes a portion of the chassis card guide system (i.e., chassis card guide 70) including an upper card guide portion 70a and a lower card guide portion 70b.

Figure 7:
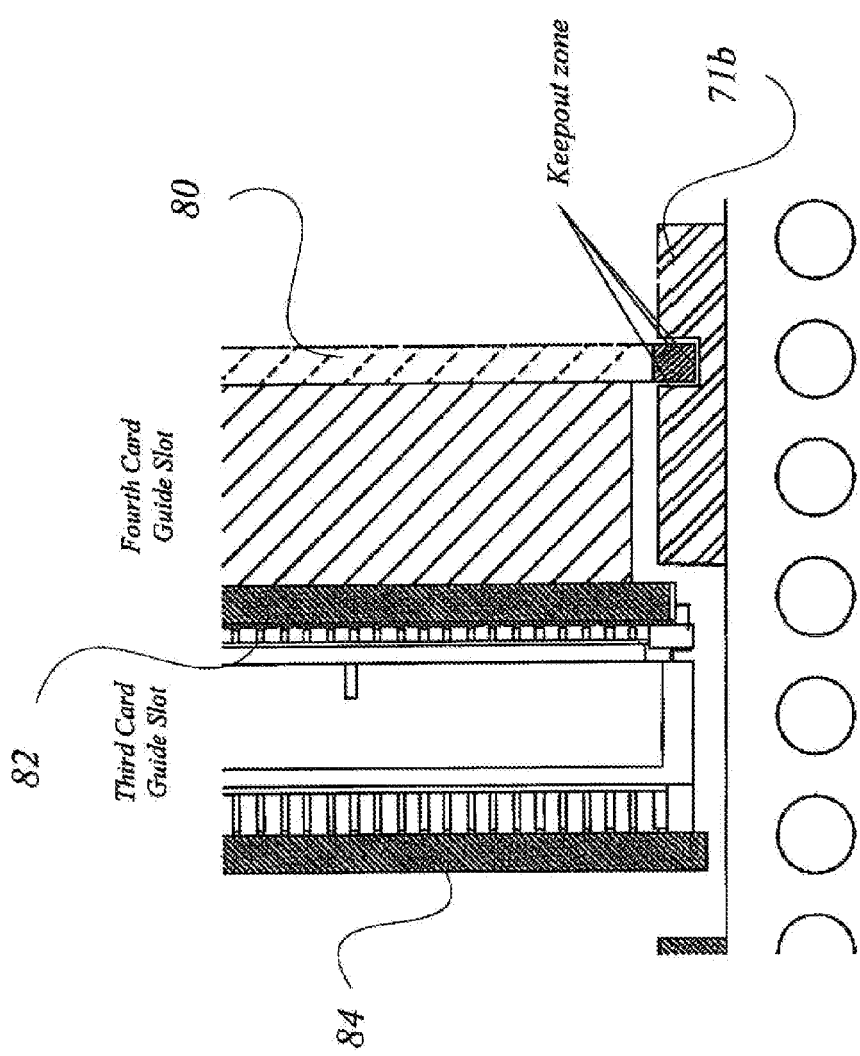
FIG. 7 is a close-up view of the third and fourth chassis card guide slots of the Micro-TCA chassis of FIG. 6.

FIG. 7 is a close-up view of the lower portion of the third and fourth chassis card guide slots of the Micro-TCA chassis 60 of FIG. 6 with the front panels removed. With specific reference to the fourth card guide slot, there is shown a keep-out zone. The keep-out zone is defined herein as an area surrounding the lower portion of the host card in the vicinity of a channel of the lower card guide 71b in which no component circuitry is allowed to be attached to the host card 80 to allow the host card 80 to be inserted into the lower card guide slot 71b without restriction.

It should be understood that the card assembly of the invention which includes the host card 80, interposer board 82 and hosted card 84 does not violate the restriction imposed by the keep-out zone.

The foregoing is to construed as only being an illustrative embodiment of this invention. Persons skilled in the art can easily conceive of alternative arrangements providing a functionality similar to this embodiment without any deviation from the fundamental principles or the scope of the invention.

What is claimed is:

1. A card assembly comprising:
   a) a single module form factor advanced mezzanine card printed wiring board (AMC PWB) as a carrier host card and configured to be accepted between opposing card guides,
   b) an interposer printed wiring board (PWB) situated between the carrier host card and one of a PCI Mezzanine card (PMC) and a switched mezzanine card (XMC) as a hosted card, wherein said carrier host card and said interposer printed wiring board (PWB) is configured to have a space there-between, the space sufficient to provide clearance between the card guides and the interposer PWB, and
   c) a customized front panel including a first cutout for the carrier host card and a second cutout for said one of the PCI Mezzanine card (PMC) and the switched mezzanine card (XMC),
   wherein a width of the interposer PWB is less than a width of the AMC PWB host card in the range of about 0.05 to about 0.15 inches, and wherein a width of the one of the PCI Mezzanine card (PMC) and the switched mezzanine card (XMC) is greater than the space between opposing card guides.

2. A card assembly according to claim 1, further comprising at least one intermediate support to provide said space between said interposer PWB and said carrier host card.

3. A card assembly according to claim 2, wherein said at least one intermediate support is selected from the group consisting of: a standoff, a part of a frame, a spacer.

4. A card assembly according to claim 1, wherein the advanced mezzanine card printed wiring board (AMC PWB) host card is convection cooled or conduction cooled.

5. An assembly comprising:
a chassis further comprising a card assembly, the card assembly comprising:
   a) a single module form factor advanced mezzanine card printed wiring board (AMC PWB) as a carrier host card and configured to be accepted between opposing card guides,
   b) an interposer printed wiring board (PWB) situated between the carrier host card and one of a PCI Mezzanine card (PMC) and a switched mezzanine card (XMC) as a hosted card, wherein said carrier host card and said interposer printed wiring board (PWB) is configured to have a space there-between, the space sufficient to provide clearance between the card guides and the interposer PWB, and
   c) a customized front panel including a first cutout for the carrier host card and a second cutout for said one of the PCI Mezzanine card (PMC) and the switched mezzanine card (XMC), wherein a width of the interposer board is less than a width of the advanced mezzanine card printed wiring board (AMC PWB) host card in the range of about 0.05 to about 0.15 inches, and wherein a width of the one of the PCI Mezzanine card (PMC) and the switched mezzanine card (XMC) is greater than the space between opposing card guides.

6. A card assembly according to claim 5, further comprising at least one intermediate support to provide said space between said interposer PWB and said carrier host card.

7. A card assembly according to claim 6, wherein said at least one intermediate support is selected from the group consisting of: a standoff, a part of a frame, a spacer.

8. A card assembly according to claim 5, wherein the advanced mezzanine card printed wiring board (AMC PWB) host card is convection cooled or conduction cooled.

\* \* \* \* \*